(12) United States Patent
Hwang et al.

(10) Patent No.: US 12,292,776 B2
(45) Date of Patent: May 6, 2025

(54) ELECTRONIC DEVICE INCLUDING SENSOR AND METHOD FOR OPERATING THE SAME

(71) Applicant: Samsung Electronics Co., Ltd., Gyeonggi-do (KR)

(72) Inventors: Minjoo Hwang, Gyeonggi-do (KR); Donghyun Yoo, Gyeonggi-do (KR); Dongyoung Kim, Gyeonggi-do (KR); Sanguk Kim, Gyeonggi-do (KR); Jongdoo Kim, Gyeonggi-do (KR); Yohan Moon, Gyeonggi-do (KR); Hanyeop Lee, Gyeonggi-do (KR); Taihwan Choi, Gyeonggi-do (KR); Hyoseok Na, Gyeonggi-do (KR); Gun Lim, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 54 days.

(21) Appl. No.: 18/207,201

(22) Filed: Jun. 8, 2023

(65) Prior Publication Data
US 2023/0409101 A1 Dec. 21, 2023

Related U.S. Application Data

(63) Continuation of application No. PCT/KR2023/005683, filed on Apr. 26, 2023.

(30) Foreign Application Priority Data

Jun. 20, 2022 (KR) .................. 10-2022-0074960
Jul. 20, 2022 (KR) .................. 10-2022-0089864

(51) Int. Cl.
*G06F 1/3231* (2019.01)
*G06F 1/3234* (2019.01)
(Continued)

(52) U.S. Cl.
CPC ........... *G06F 1/3231* (2013.01); *H01Q 1/243* (2013.01); *H03K 17/955* (2013.01);
(Continued)

(58) Field of Classification Search
CPC ..... G06F 1/3231; G06F 1/3234; H01Q 1/243; H01Q 1/52; H03K 17/955; H04W 52/0254
See application file for complete search history.

(56) References Cited

U.S. PATENT DOCUMENTS

2010/0214259 A1 8/2010 Philipp et al.
2012/0190398 A1* 7/2012 Leukkunen .......... H04B 7/0691
455/522

(Continued)

FOREIGN PATENT DOCUMENTS

CN 112864583 A 5/2021
KR 10-2012-0092062 A 8/2012
(Continued)

OTHER PUBLICATIONS

International Search Report dated Jul. 28, 2023.

*Primary Examiner* — Terrell S Johnson
(74) *Attorney, Agent, or Firm* — Cha & Reiter, LLC

(57) ABSTRACT

According to an embodiment, an electronic device may comprise an antenna circuit including an antenna, a first capacitor, a switch, a sensor, and at least one processor. The at least one processor may be configured to control the switch to connect the first capacitor and the sensor, based on start of booting of the electronic device, determine an initial value of the sensor for determining whether a user grips at least a portion of the electronic device, based on the connection of the first capacitor and the sensor, and control the switch to connect the antenna circuit and the sensor, based (Continued)

on the determination of the initial value of the sensor. Other various embodiments are possible as well.

20 Claims, 8 Drawing Sheets

(51) Int. Cl.
  *H01Q 1/24* (2006.01)
  *H01Q 1/52* (2006.01)
  *H03K 17/955* (2006.01)
  *H04W 52/02* (2009.01)

(52) U.S. Cl.
  CPC ....... *H04W 52/0254* (2013.01); *G06F 1/3234* (2013.01); *H01Q 1/52* (2013.01)

(56) References Cited

U.S. PATENT DOCUMENTS

| | | |
|---|---|---|
| 2014/0066124 A1 | 3/2014 | Novet |
| 2014/0091817 A1 | 4/2014 | Besshi |
| 2015/0237183 A1 | 8/2015 | Novet |
| 2016/0299010 A1 | 10/2016 | Park |
| 2017/0134022 A1 | 5/2017 | Kim et al. |
| 2018/0054196 A1* | 2/2018 | Yang ........................ H04B 5/72 |
| 2019/0312361 A1 | 10/2019 | Nakanishi |
| 2020/0218310 A1 | 7/2020 | Kim et al. |
| 2021/0034195 A1* | 2/2021 | Lee ........................ G01R 27/26 |
| 2021/0091465 A1* | 3/2021 | Park .................... H04W 52/146 |
| 2021/0105350 A1 | 4/2021 | Kim |
| 2021/0306022 A1 | 9/2021 | Fernando et al. |
| 2022/0225244 A1* | 7/2022 | Lee ....................... H04B 7/0404 |
| 2023/0006333 A1 | 1/2023 | Wu et al. |

FOREIGN PATENT DOCUMENTS

| | | |
|---|---|---|
| KR | 10-2017-0054981 A | 5/2017 |
| KR | 10-2019-0050536 A | 5/2019 |
| KR | 10-2020-0085546 A | 7/2020 |
| KR | 10-2021-0039731 A | 4/2021 |
| KR | 10-2021-0092611 A | 7/2021 |
| KR | 10-2278141 B1 | 7/2021 |
| KR | 10-2022-0023160 A | 3/2022 |

* cited by examiner

ELECTRONIC DEVICE INCLUDING SENSOR AND METHOD FOR OPERATING THE SAME

CROSS-REFERENCE TO RELATED APPLICATION(S)

This application is a continuation of PCT International Application No. PCT/KR2023/005683, which was filed on Apr. 26, 2023, and claims priority to Korean Patent Application Nos. 10-2022-0074960 and 10-2022-0089864, filed on Jun. 20, 2022 and Jul. 20, 2022, respectively, in the Korean Intellectual Property Office, the disclosure of which are incorporated by reference herein their entirety.

BACKGROUND

Technical Field

Various embodiments of the disclosure relate to an electronic device including a sensor and a method for operating the same.

Description of Related Art

Electronic devices generate electromagnetic waves when used. Recently, considering the effect of electromagnetic waves generated by electronic devices on the user's body, standards for a specific absorption rate (SAR) harmless to the human body have been established and managed according to international standards for electronic devices. In this case, the specific absorption rate means the amount of energy per unit mass of the electromagnetic waves generated from the electronic device and absorbed by the human body.

Therefore, electronic device are required to be designed to generate electromagnetic waves at a level lower than the specific absorption rate determined to be harmless to the human body according to international standards.

SUMMARY

According to an embodiment, an electronic device may comprise an antenna circuit including an antenna, a first capacitor, a switch, a sensor, and at least one processor.

According to an embodiment, the at least one processor may be configured to control the switch to connect the first capacitor and the sensor, based on start of booting of the electronic device.

According to an embodiment, the at least one processor may be configured to determine an initial value of the sensor for determining whether a user grips at least a portion of the electronic device, based on the connection of the first capacitor and the sensor.

According to an embodiment, the at least one processor may be configured to control the switch to connect the antenna circuit and the sensor, based on the determination of the initial value of the sensor.

According to an embodiment, a method for operating an electronic device may comprise controlling a switch included in the electronic device to connect a first capacitor included in the electronic device and a sensor included in the electronic device, based on start of booting of the electronic device.

According to an embodiment, the method for operating the electronic device may comprise determining an initial value of the sensor for determining whether a user grips at least a portion of the electronic device, based on the connection of the first capacitor and the sensor.

According to an embodiment, the method for operating the electronic device may comprise controlling the switch to connect an antenna circuit included in the electronic device and the sensor, based on the determination of the initial value of the sensor.

According to an embodiment, an electronic device may comprise an antenna circuit including an antenna; a first capacitor, a sensor, and at least one processor.

According to an embodiment, the at least one processor may be configured to connect the first capacitor and the sensor using a first channel connected to the sensor, based on start of booting of the electronic device.

According to an embodiment, the at least one processor may be configured to determine an initial value of the sensor for determining whether at least a portion of the electronic device is gripped, based on the connection of the first capacitor and the sensor.

According to an embodiment, the at least one processor may be configured to connect the antenna circuit and the sensor using a second channel connected to the sensor, based on the determination of the initial value of the sensor.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
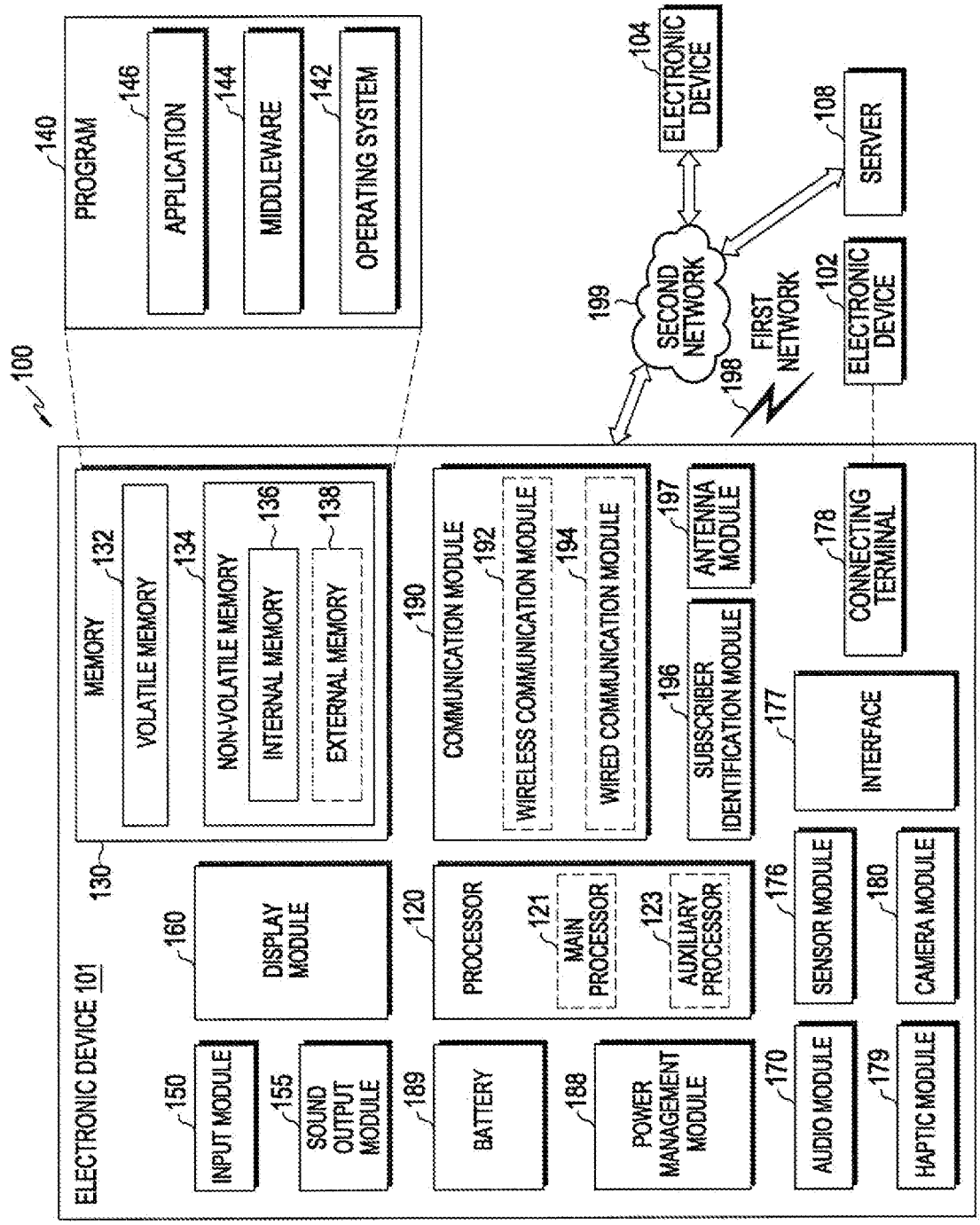
FIG. 1 is a block diagram illustrating an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with at least one of an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The term "processor" should be understood as referring to both singular and plural contexts in the disclosure.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an accelerometer, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna.

The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module 197 may include one antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments of the disclosure may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The electronic device may include various sensors, such as a grip sensor, to detect whether the user's body approaches or contacts the electronic device. The electronic device may determine the degree of proximity or contact to the user's body based on variation in capacitance of a dielectric material.

Generally, when performing a booting operation, the electronic device may determine an initial value of a sensor (e.g., grip sensor). Before booting of the electronic device is completed, the user's body may approach or come into contact with the electronic device. In this case, the initial value of the sensor may be determined in the state in which the user's body is in proximity or contact. In other words, the electronic device may not be able to identify the variation in capacitance based on the initial value even when the user's body approaches or comes into contact with it. Thus, the electronic device may not be able to determine whether the user's body is in proximity or contact with the electronic device.

Further, due to these issues, the electronic device may not recognize that the electromagnetic waves generated by the electronic device deviate from a specific absorption rate standard.

In an embodiment, there may be provided an electronic device and a method for operating the same, which determine an initial value of a sensor using a capacitor having the same capacitance as the capacitance of an antenna circuit upon starting the booting of the electronic device and determines whether the user grips the electronic device using the initial value.

According to an embodiment, there may be provided an electronic device and method for determining an initial value of a sensor using a capacitor having the same capacitance as the capacitance of an antenna circuit upon starting the booting of the electronic device. The electronic device may prevent the sensor from malfunctioning based on the initial value. Further, the electronic device may determine the strength of electromagnetic waves generated by the electronic device so that a specific absorption rate standard is met.

Figure 2:
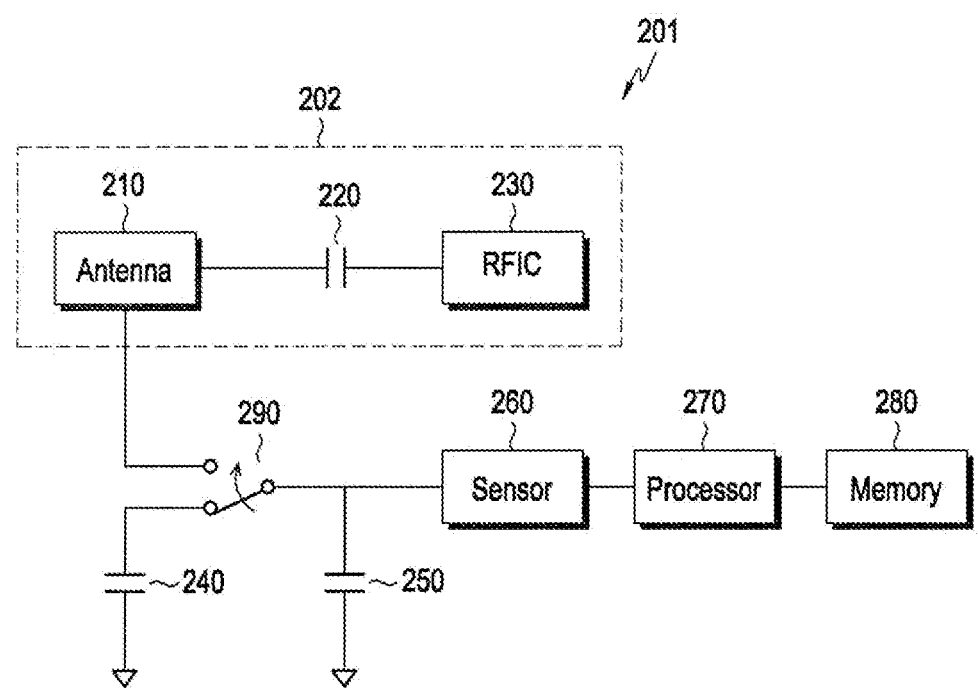
FIG. 2 is a schematic circuit diagram illustrating an electronic device according to an embodiment.

FIG. 2 is a schematic circuit diagram illustrating an electronic device according to an embodiment.

According to an embodiment, an electronic device 201 may include an antenna circuit 202, a first capacitor 240, a third capacitor 250, a sensor 260, a processor 270, a memory 280, and/or a switch 290. For example, the electronic device 201 may be implemented to be identical or similar to the electronic device 101 of FIG. 1. The processor 270 may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, it would be recognized that when a general purpose computer accesses code for implementing the processing shown herein, the execution of the code transforms the general purpose computer into a special purpose computer for executing the processing shown herein. Certain of the functions and steps provided in the Figures may be implemented in hardware, software or a combination of both and may be performed in whole or in part within the programmed instructions of a computer. No claim element herein is to be construed as means-plus-function, unless the element is expressly recited using the phrase "means for." In addition, an artisan understands and appreciates that a "processor" or "microprocessor" may be hardware in the claimed disclosure.

According to an embodiment, the antenna circuit 202 may include an antenna 210, a second capacitor 220, and/or a radio frequency integrated circuit (RFIC) 230. The antenna circuit 202 may transmit and receive signals with external electronic devices (e.g., the electronic devices 102, 104, and 108 of FIG. 1) under the control of the processor 270. For example, the antenna circuit 202 may be implemented to be identical or similar to the antenna module 197 of FIG. 1.

According to an embodiment, the antenna 210 may perform the roles of both a radiator capable of transmitting signals and a conductor for obtaining a capacitance variation.

According to an embodiment, at least one capacitor may be connected between the antenna 210 and the RFIC 230. For example, the second capacitor 220 in FIG. 2 may represent an equivalent capacitor having the same value as the capacitance of at least one capacitor connected between the antenna 210 and the RFIC 230 or the capacitance of the antenna circuit 202.

According to an embodiment, the first capacitor 240 may be a capacitor having the same capacitance as the second capacitor 220. According to an embodiment, one end of the first capacitor 240 may be connected to ground, and the other end of the first capacitor 240 may be connected to the third capacitor 250 and the sensor 260 through the switch 290. According to an embodiment, the first capacitor 240 may include a shunt capacitor. For example, the first capacitor 240 may be connected in parallel with the third capacitor 250. Meanwhile, in FIG. 2, one capacitor is shown as the first capacitor 240, but embodiments of the present invention may not be limited thereto. For example, the first capacitor 240 may include a plurality of capacitors rather than one capacitor. For example, the first capacitor 240 may represent an equivalent capacitor having the same value as the capacitance of the plurality of capacitors.

According to an embodiment, one end of the third capacitor 250 may be connected to ground. The other end of the third capacitor 250 may be connected to the first capacitor 240 and the sensor 260 through the switch 290. In FIG. 2, one capacitor is shown as the third capacitor 250, but embodiments of the present invention may not be limited thereto. For example, the third capacitor 250 may include a plurality of capacitors rather than one capacitor. For example, the third capacitor 250 may represent an equivalent capacitor having the same value as the capacitance of the plurality of capacitors.

According to an embodiment, the sensor 260 may include a grip sensor for determining whether an external object contacts and/or approaches at least a portion of the electronic device 201. The sensor 260 may obtain sensing values by detecting variations in capacitance when an external object (e.g., the user's hand) contacts and/or approaches at least a portion of the electronic device 201. For example, the sensor 260 may obtain sensing values by detecting variations in the capacitance of a conductor (e.g. the antenna 210) when an external object (e.g., the user's hand) contacts and/or approaches an area where the antenna 210 is positioned. For example, the sensor 260 may be implemented to be identical or similar to the sensor module 176 of FIG. 1.

According to an embodiment, the sensor 260 may be electrically connected to the processor 270. According to an embodiment, the sensor 260 may transfer the obtained sensing values to the processor 270.

According to an embodiment, the processor 270 may control the overall operation of the electronic device 201. For example, the processor 270 may control the switch 290 so that the first capacitor 240 and the sensor 260 are connected. According to an embodiment, the processor 270 may control the switch 290 so that the antenna circuit 202 and the sensor 260 are connected. According to an embodiment, the processor 270 may determine the strength of the signal to be transmitted through the antenna 210 based on the sensing value obtained from the sensor 260. In other words, the processor 270 may determine the strength of the signal to be transmitted through the antenna 210 (e.g., increase the strength of the signal) for better communication upon identifying that at least a portion of the user's body approaches or contacts at least a portion (e.g., the area where the antenna 210 is positioned in the electronic device 201) of the electronic device 201 through the sensor 260. The processor 270 may be implemented to be identical or similar to the processor 120 of FIG. 1.

According to an embodiment, the memory 280 may store the initial value of the sensor 260 determined by the processor 270. Further, the memory 280 may store a value preset for the signal to be transmitted through the antenna 210. The processor 270 may determine whether the strength of the signal to be transmitted through the antenna 210 exceeds the preset value stored in the memory 280. The memory 280 may be implemented to be identical or similar to the memory 130 of FIG. 1.

According to an embodiment, one end of the switch 290 may be connected to the sensor 260, and the other end may be connected to the first capacitor 240 or the antenna circuit 202. According to an embodiment, the processor 270 may control the switch 290 to connect the other end of the switch 290 to the first capacitor 240 to determine the initial value of the sensor 260, which in turn is used for determining whether an external object (e.g., the user's body) approaches and/or contacts at least a portion (e.g., the area where the antenna 210 is positioned in the electronic device 201) of the electronic device 201. The processor 270 may determine the initial value of the sensor 260 while the other end of the switch 290 is connected to the first capacitor 240. For example, the initial value of the sensor 260 may be set during the booting operation, during a factory reset, or during an operation for resetting the initial value (e.g., an operation or function test operation for resetting the initial value by connecting an external cable to the electronic device 201). The determination of the initial value of the sensor 260 by the electronic device 201 is described below in detail with reference to FIG. 3A.

According to an embodiment, when one end of the switch 290 is connected with the sensor 260, and the other end of the switch 290 is connected with the antenna circuit 202, the processor 270 may obtain the sensing values for determining whether an external object approaches and/or contacts at least a portion (e.g., the area where the antenna 210 is positioned in the electronic device 201) of the electronic device 201 using the sensor 260. Obtaining the sensing values by the processor 270 using the sensor 260 is described below in detail with reference to FIG. 3B.

Figure 3A:
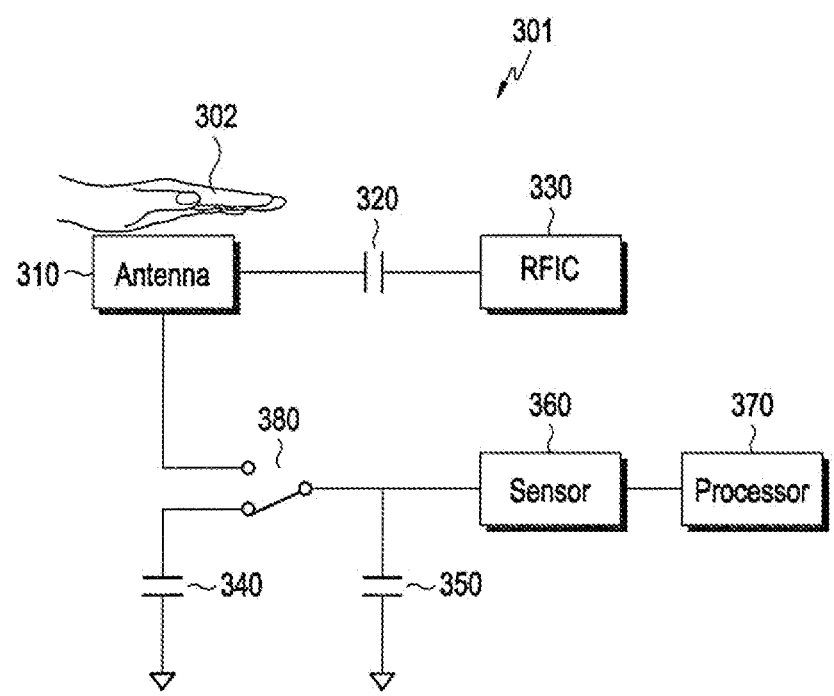
FIG. 3A is a schematic circuit diagram illustrating an electronic device when determining an initial value of a sensor according to an embodiment.

FIG. 3A is a schematic circuit diagram illustrating an electronic device when determining an initial value of a sensor according to an embodiment. FIG. 3A illustrates an example in which an external object (e.g., the user's hand) 301 approaches and/or contacts the antenna 310.

According to an embodiment, a processor 370 (e.g., the processor 270 of FIG. 2) may control a switch 380 (e.g., the switch 290 of FIG. 2) to connect the first capacitor 340 (e.g., the first capacitor 240 of FIG. 2) and the sensor 360 (e.g., the sensor 260 of FIG. 2) in a state in which the sensor 360 (e.g., the sensor 260 of FIG. 2) and the antenna 310 (e.g., the antenna 210 of FIG. 2) are not connected based on the start of booting of the electronic device 301 (e.g., the electronic device 201 of FIG. 2).

According to an embodiment, the processor 270 may control the switch 380 so that the antenna 310 and the sensor 360 are not connected. The processor 270 may determine an initial value of the sensor 360 based on the connection between the first capacitor 340 and the sensor 360. In other words, the initial value of the sensor 360 may be set in a state in which the antenna 310 and the sensor 360 are not connected. Thus, the processor 370 may set the initial value of the sensor 360 in the same state as the state in which the external object 302 does not approach and/or contact at least a portion (e.g., the area where the antenna 310 is positioned in the electronic device 301) of the electronic device 301.

Therefore, the processor 370 may prevent changes to the initial value of the sensor 360 due to the approach and/or contact of the external object 302 to at least a portion (e.g., the area where the antenna 310 is positioned in the electronic device 301) of the electronic device 301 in the initial value setup step of the sensor 360. Further, the processor 370 may prevent the sensor 360 from malfunctioning due to changes in the initial value. For example, the electronic device 301 may determine the initial value of the sensor 360 using the first capacitor 340 having the same capacitance as the second capacitor 320.

According to an embodiment, the processor 370 may set the initial value of the sensor 360 upon meeting a predesignated condition for setting the initial value of the sensor 360 (e.g., an external cable is connected to the electronic device 301 or a function test is performed) is met, as well as the start of booting of the electronic device 301. In this case, the processor 370 may control the switch 380 so that the sensor 360 is connected to the first capacitor 340 instead of the antenna 310. In other words, even when the electronic device 301 is not in the initial booting operation, when it meets the predesignated condition (an external cable is connected to the electronic device 301 or a function test is performed), the processor 370 may determine the initial value of the sensor 360 based on connection of the first capacitor 340 and the sensor 360.

According to an embodiment, when the first capacitor 340 and the sensor 360 are connected, the electronic device 301 may perform calibration of the sensor 360 based on the determined initial value. For example, the calibration may include an operation for determining an initial value based on the capacitance of the equivalent capacitor of the first capacitor 340 and the third capacitor 350 of the sensor 360 and/or an operation for determining an initial setting value of the sensor 360 other than the initial value. However, this is merely an example, and embodiments of the present invention may not be limited thereto.

Figure 3B:
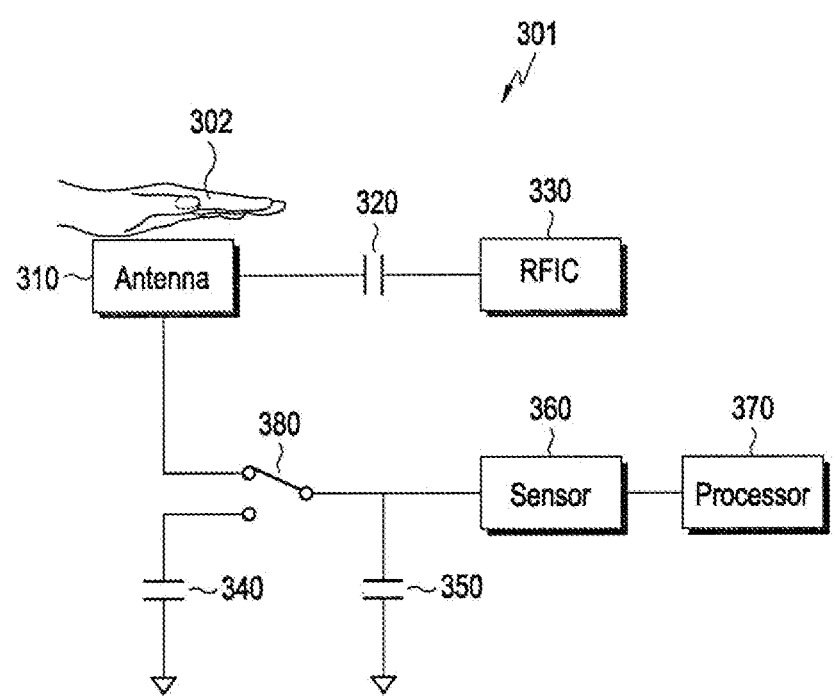
FIG. 3B is a schematic circuit diagram illustrating an electronic device when a sensor and an antenna circuit are connected after determining an initial value according to an embodiment.

FIG. 3B is a schematic circuit diagram illustrating an electronic device when a sensor and an antenna circuit are connected after determining an initial value according to an embodiment.

FIG. 3B illustrates an example in which an external object (e.g., the user's hand) 302 approaches and/or contacts the antenna 310.

According to an embodiment, the processor 370 (e.g., the processor 270 of FIG. 2) may control the switch 380 to connect the antenna 310 and the sensor 360.

According to an embodiment, the processor 370 may obtain a sensing value for determining whether the external object 302 approaches and/or contacts at least a portion (e.g., the area where the antenna 310 is positioned in the electronic device 301) of the electronic device 301 using the sensor 360 based on connection of the antenna 310 and the sensor 360. In this case, the processor 370 may obtain the sensing value based on the initial value of the sensor 360 obtained in FIG. 3A. For example, when the external object 302 approaches and/or contacts at least a portion (e.g., the area where the antenna 310 is positioned in the electronic device 301) of the electronic device 301, the processor 370 may obtain the sensing value based on the variation in capacitance. The processor 370 may determine the variation in capacitance by comparing the initial value of the sensor 360 determined in the booting operation of the electronic device 301 and the value obtained by the sensor 360 after booting of the electronic device 301 is completed. The processor 370 may determine how close the external object 302 is to at least a portion (e.g., the area where the antenna 310 is positioned in the electronic device 301) of the electronic device 301 based on the determined variation in capacitance.

According to an embodiment, the processor 370 may determine the strength of the signal to be transmitted through the antenna 310 based on the sensing value obtained through the sensor 360.

According to an embodiment, the processor 370 may identify the strength of the signal and a preset value stored in the memory (e.g., the memory 280 of FIG. 2) when determining the strength of the signal to be transmitted. For example, the preset value may relate to the value of the strength of the signal to be transmitted through the antenna 310. According to an embodiment, the preset value may be a value set based on the specific absorption rate (SAR) value. However, this is exemplary, and embodiments of the present invention may not be limited thereto.

According to an embodiment, the processor 370 may compare the determined signal strength with a preset value. The processor 370 may adjust the strength of the signal to be transmitted through the antenna 310 based on the comparison result. For example, the processor 370 may transmit a signal having the determined strength through the antenna 310 when the determined signal strength is equal to or less than a preset value. Or, when the determined signal strength exceeds the preset value, the processor 370 may adjust the signal strength to have the preset value. Or, according to an embodiment, when the determined signal strength exceeds the preset value, the processor 370 may adjust the signal strength to have the preset value or less based on a preset criterion. According to the above-described method, the processor 370 may transmit signals with the adjusted signal strength through the antenna 310. However, this is an example of adjusting the signal strength, and embodiments of the present invention may not be limited thereto.

Figure 4:
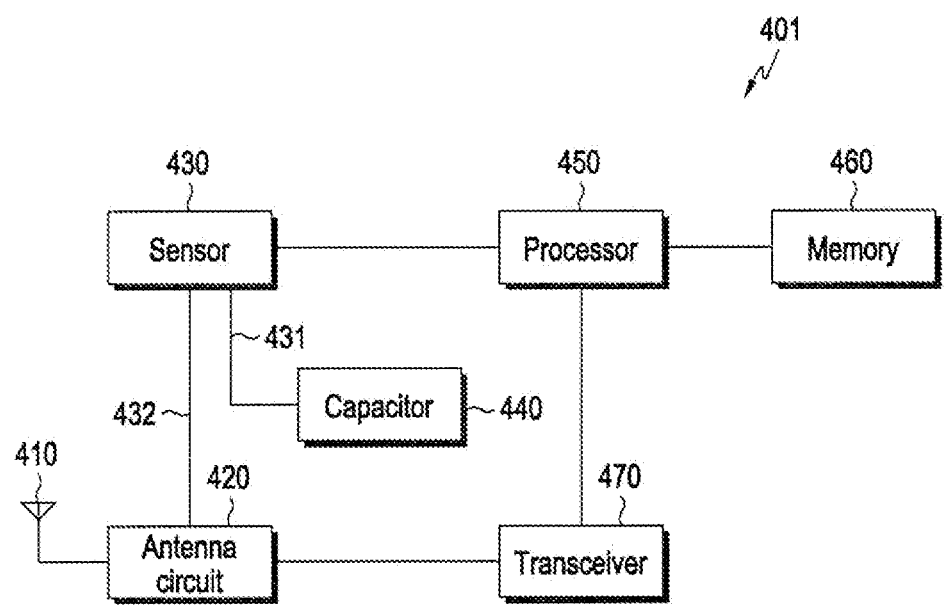
FIG. 4 is a schematic block diagram illustrating an electronic device according to an embodiment.

FIG. 4 is a schematic block diagram illustrating an electronic device according to an embodiment.

According to an embodiment, an electronic device 401 may include an antenna 410, an antenna circuit 420, a sensor 430, a capacitor 440, a processor 450, a memory 460, and/or a transceiver 470. For example, the electronic device 401 may be implemented to be identical or similar to the electronic device 101 of FIG. 1.

According to an embodiment, the processor 450 may select any one of the plurality of channels 431 and 432 connected to the sensor 430. For example, the processor 450 may connect the sensor 430 and the capacitor 440 through the first channel 431. Or, the processor 450 may connect the sensor 430 and the antenna circuit 420 through the second channel 432. One end of the first channel 431 may be connected to the sensor 430, and the other end of the first channel 431 may be connected to the capacitor 440. One end of the second channel 432 may be connected to the sensor 430, and the other end of the second channel 432 may be connected to the antenna circuit 420. The antenna circuit 420 may be implemented to be identical or similar to the antenna circuit 202 of FIG. 2.

According to an embodiment, the processor 450 may connect the sensor 430 and the capacitor 440 through the first channel 431 to set an initial value of the sensor 430. For example, the processor 450 may connect the sensor 430 and the capacitor 440 through the first channel 431 based on the start of booting of the electronic device 401. In other words, the processor 450 may connect the capacitor 440 and the sensor 430 through the first channel 431 in a state in which the sensor 430 and the antenna circuit 420 are not connected.

According to an embodiment, the capacitor 440 may be implemented as an equivalent capacitor having the same capacitance as the internal capacitor value of the antenna circuit 420.

According to an embodiment, the processor 450 may determine the initial value of the sensor 430 based on the connection between the capacitor 440 and the sensor 430 through the first channel 431 in a state in which the antenna circuit 420 and the sensor 430 are not connected.

According to an embodiment, the processor 450 may connect the sensor 430 and the antenna circuit 420 through the second channel 432. According to an embodiment, the processor 450 may obtain the sensing value of the sensor 430 indicating whether an external object (e.g., the user's body) approaches and/or contacts at least a portion (e.g., the area where the antenna 410 is positioned in the electronic device 401) of the electronic device 401, based on the connection between the antenna circuit 420 and the sensor 430 through the second channel 432. In this case, the processor 450 may determine whether the external object approaches and/or contacts at least a portion of the electronic device 401 based on the initial value of the sensor 430 obtained in the state in which the antenna circuit 420 and the sensor 430 are not connected.

According to an embodiment, the processor 450 may determine the strength of the signal to be transmitted through the antenna 410 based on the sensing value obtained from the sensor 430.

According to an embodiment, the transceiver 470 may convert and/or generate data received from the processor 450 into a signal. Further, the transceiver 470 may amplify the signal based on the strength of the signal determined by the processor 450 through an amplifier (not shown). The transceiver 470 may output the amplified signal through the antenna 410.

At least some of the operations of the electronic device 201, 301, or 401 described below may be performed by the processor 270, 370, or 450. However, for convenience of description, it is described that the electronic device 201, 301, or 401 performs corresponding operations.

Figure 5:
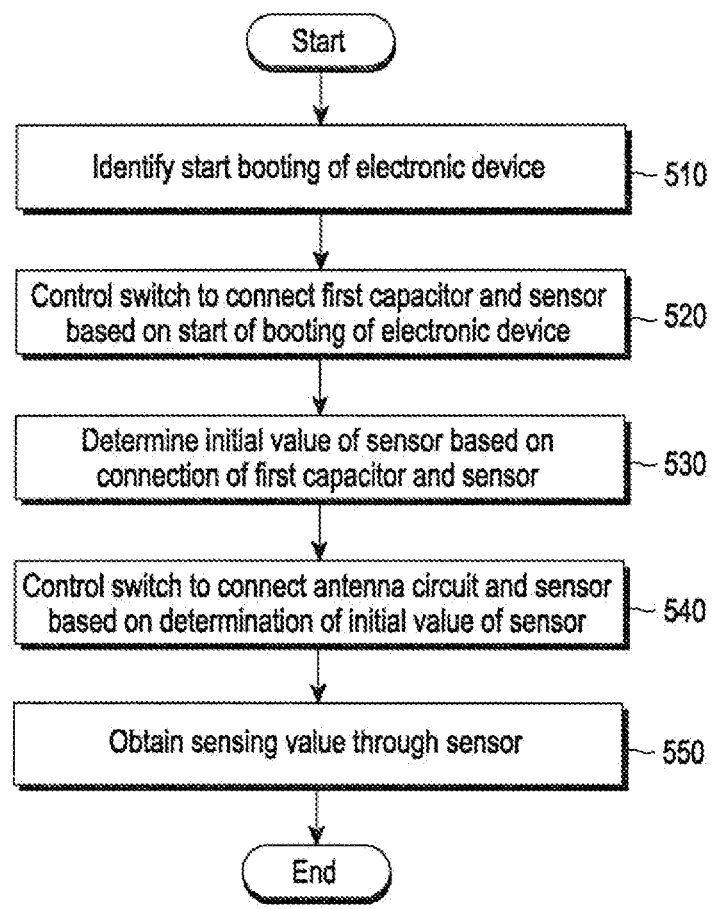
FIG. 5 is a flowchart illustrating an operation of obtaining a sensing value through a sensor by an electronic device according to an embodiment.

FIG. 5 is a flowchart illustrating an operation of obtaining a sensing value through a sensor by an electronic device according to an embodiment.

According to an embodiment, an electronic device (e.g., a processor (e.g., 270 of FIG. 2 or 370 of FIGS. 3A and 3B)) may identify the start of booting of the electronic device (e.g., 201 of FIG. 2 or 301 of FIGS. 3A and 3B) in operation 510. Or, according to an embodiment, the electronic device 201 or 301 may identify a predesignated condition (e.g., an external cable is connected to the electronic device 201 or 301 or the function test of the electronic device 201 or 301 is performed) for setting an initial value of the sensor (e.g., 260 of FIG. 2 or 360 of FIG. 3). According to an embodiment, the electronic device 201 or 301 may control the switch (e.g., 290 of FIG. 2 or 380 of FIGS. 3A and 3B) to connect the first capacitor (e.g., 240 of FIG. 2 or 340 of FIGS. 3A and 3B) and the sensor 260 or 360 based on the start of booting of the electronic device 201 or 301 in operation 520. Or, according to an embodiment, the electronic device 201 or 301 may control the switch 290 or 380 to connect the first capacitor 240 or 340 and the sensor 260 or 360 based on the predesignated condition (e.g., an external cable is connected to the electronic device 201 or 301 or the function test of the electronic device 201 or 301 is performed) for setting the initial value of the sensor 260 or 360.

According to an embodiment, in operation 530, the electronic device 201 or 301 may determine the initial value of the sensor 260 or 360 based on connection of the first capacitor 240 or 340 and the sensor 260 or 360. According to an embodiment, the electronic device 201 or 301 may perform calibration of the sensor 260 or 360 based on the determined initial value. Calibration may refer to an operation for determining the initial value and/or an operation for determining an initial setting value of the sensors 260 and 360 other than the initial value, as described above in FIG. 3A. However, this is merely an example, and various embodiments of the present invention are not limited thereto.

According to an embodiment, the electronic device 201 or 301 may control the switch 290 or 380 to connect the antenna circuit 202 and the sensor 260 or 360 based on the determination of the initial value of the sensor 260 or 360 in operation 540. For example, the electronic device 201 or 301 may control the switch 290 or 380 to connect the antenna circuit (e.g., the antenna circuit 202 of FIG. 2) and the sensor after the initial value of the sensor 260 or 360 is determined.

According to an embodiment, the electronic device 201 or 301 may obtain a sensing value indicating whether an external object (e.g., the user's body) approaches and/or contacts at least a portion of the electronic device 201 or 301 through the sensor 260 or 360 in operation 550.

Figure 6:
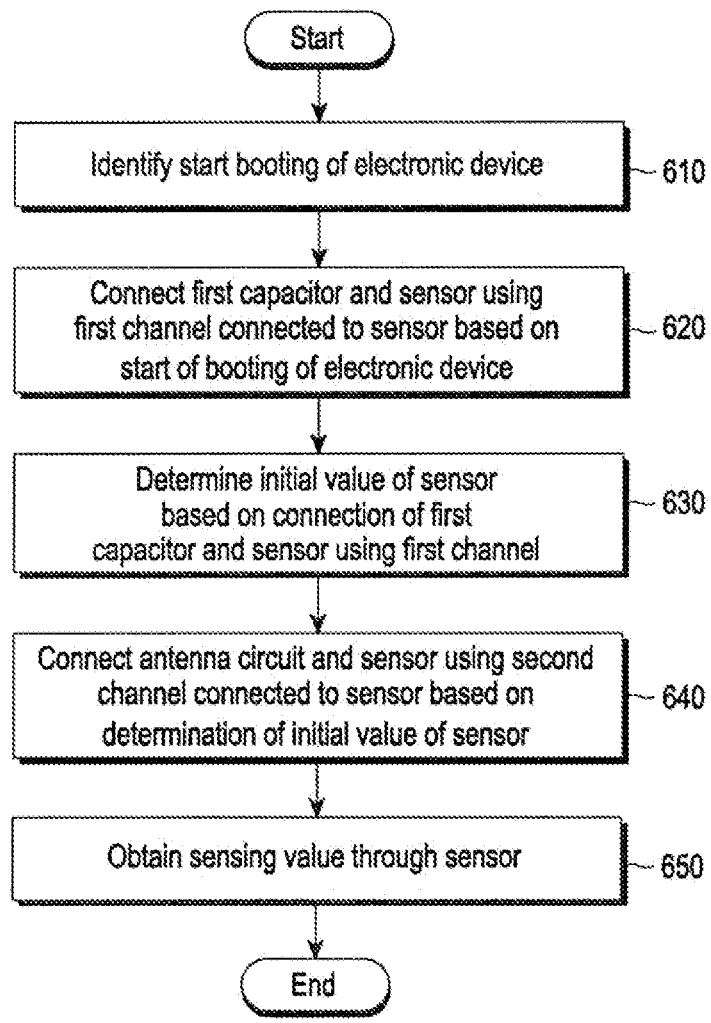
FIG. 6 is a flowchart illustrating an operation of obtaining a sensing value through a sensor by an electronic device according to an embodiment.

FIG. 6 is a flowchart illustrating an operation of obtaining a sensing value through a sensor by an electronic device according to an embodiment.

According to an embodiment, in operation 610, the electronic device 401 (e.g., the processor (e.g., 450 of FIG. 4)) may identify the start of booting of the electronic device (e.g., 401 of FIG. 4). Or, according to an embodiment, the electronic device 401 may identify a predesignated condition (e.g., an external cable is connected to the electronic device 401 or the function test of the electronic device 401 is performed) for setting an initial value of the sensor (e.g., 430 of FIG. 4).

According to an embodiment, in operation 620, the electronic device 401 may connect the first capacitor (e.g., 440 of FIG. 4) and the sensor 430 through the first channel (e.g., 431 of FIG. 4) connected to the sensor 430 based on the start of booting of the electronic device 401. Or, according to an embodiment, the electronic device 401 may connect the first capacitor 440 and the sensor 430 using the first channel 431 connected to the sensor 430 based on the predesignated condition (e.g., an external cable is connected to the electronic device 401 or the function test of the electronic device 401 is performed) for setting the initial value of the sensor 430.

According to an embodiment, in operation 630, the electronic device 401 may determine the initial value of the sensor 430 based on connection of the first capacitor 440 and the sensor 430 using the first channel 431.

According to an embodiment, in operation 640, the electronic device 401 may connect the antenna circuit (e.g., 420 of FIG. 4) and the sensor 430 using the second channel (e.g., 432 of FIG. 4) connected to the sensor 430, based on the determination of the initial value of the sensor 430.

According to an embodiment, in operation 650, the electronic device 401 may obtain the sensing value through the sensor 430.

Figure 7:
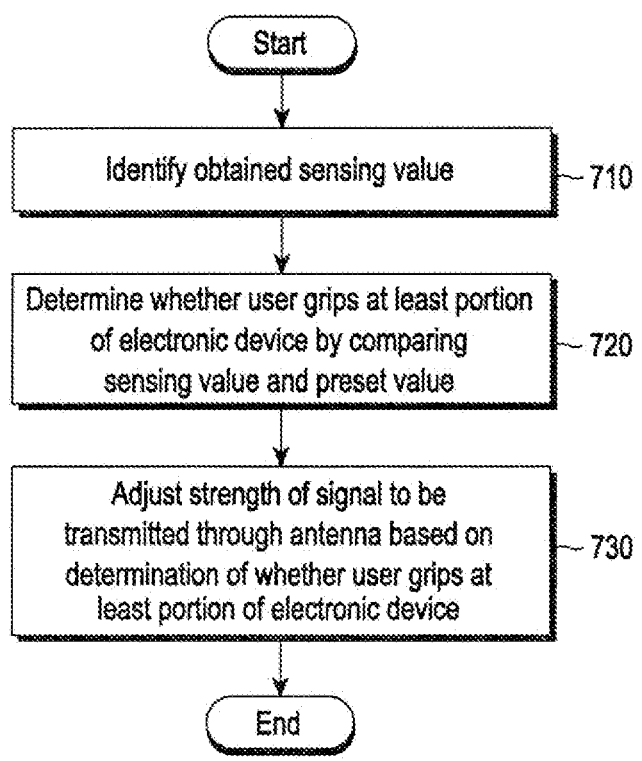
FIG. 7 is a flowchart illustrating an operation of adjusting a strength of a signal to be transmitted through an antenna by an electronic device according to an embodiment.

FIG. 7 is a flowchart illustrating an operation of adjusting a strength of a signal to be transmitted through an antenna by an electronic device according to an embodiment.

According to an embodiment, in operation 710, the electronic device 201, 301, or 401 (e.g., the processor (e.g., 270 of FIG. 2, 370 of FIGS. 3A and 3B, or 450 of FIG. 4) may identify the sensing value through the sensor (e.g., 260 of FIG. 2, 360 of FIG. 3, or 430 of FIG. 4).

According to an embodiment, in operation 720, the electronic device 201, 301, or 401 may determine whether the user grips at least a portion of the electronic device by comparing the sensing value with a preset value. According to an embodiment, when the sensing value obtained through the sensor (e.g., 260 of FIG. 2, 360 of FIG. 3, or 430 of FIG. 4) is a preset value or more, the electronic device 201, 301, or 401 may determine that the user has gripped (e.g., approaches and/or contacts) at least a portion of the electronic device. According to an embodiment, when the sensing value obtained through the sensor (e.g., 260 of FIG. 2, 360 of FIG. 3, or 430 of FIG. 4) is less than the preset value, the electronic device 201, 301, or 401 may determine that the user does not grip (e.g., approaches and/or contacts) at least a portion of the electronic device.

According to an embodiment, in operation 730, the electronic device 201, 301, or 401 may adjust the strength of the signal to be transmitted through the antenna 210, 310, or 410 based on the determination of whether the user has gripped at least a portion of the electronic device. The strength of the signal to be transmitted through the antenna 210, 310, or 410 may be a strength determined based on the obtained sensing value.

According to an embodiment, upon determining that the user does not grip (e.g., approaches and/or contacts) at least a portion of the electronic device, the electronic device 201, 301, or 401 may transmit a signal through the antenna 210, 310, or 410 in the signal strength determined based on the sensing value.

According to an embodiment, upon determining that the user grips (e.g., approaches and/or contacts) at least a portion of the electronic device, the electronic device 201, 301, or 401 may adjust the strength of the signal to be transmitted through the antenna 210, 310, or 410. For example, when the strength of the signal determined based on the sensing value is a preset value or less, the electronic device 201, 301, or 401 may transmit the signal in the determined signal strength. According to an embodiment, when the determined signal strength exceeds the preset value, the electronic device 201, 301, or 401 may adjust the signal strength to have the signal strength of the preset value. Or, according to an embodiment, when the determined signal strength exceeds the preset value, the electronic device 201, 301, or 401 may adjust the signal strength to have a signal strength of the preset value or less based on a preset criterion. For example, the preset value may be a value set based on a designated specific absorption rate (SAR) value. However, this is exemplary, and embodiments of the present invention may not be limited thereto.

By the above-described method, the electronic device 201, 301, or 401 may transmit the signal in the adjusted signal strength through the antenna 210, 310, or 410. However, this is an example of adjusting the signal strength, and various embodiments of the present invention may not be limited thereto.

According to an embodiment, the first capacitor (e.g., 240 of FIG. 2 or 340 of FIGS. 3A and 3B) may have the same capacitance as the second capacitor (e.g., 220 of FIG. 2 or 320 of FIGS. 3A and 3B). However, although the first capacitor is implemented in the circuit and is intended to have the same capacitance as the capacitance of the second capacitor, a difference in capacitance may actually occur between the two capacitors due to temperature. Accordingly, the processor (e.g., 270 of FIG. 2 or 370 of FIGS. 3A and 3B) may perform a compensation process for reducing the difference in capacitance between the two capacitors before determining the initial value of the sensor. For example, the processor may compare the capacitance of the first capacitor at the first temperature with the capacitance of the second capacitor at a first temperature, obtaining a first value which is a difference between the two capacitances. The processor may compare the capacitance of the first capacitor at the second temperature with the capacitance of the second capacitor at a second temperature, obtaining a second value which is a difference between the two capacitances. The processor may store the difference (e.g., the first value and the second value) between the two capacitances obtained at a specific temperature (e.g., the first temperature and the second temperature) as data. The processor may compensate for the capacitance of the first capacitor so that the capacitance of the first capacitor has the same value as the capacitance of the second capacitor based on the data.

According to an embodiment, an electronic device may comprise an antenna circuit including an antenna, a first capacitor, a switch, a sensor, and at least one processor.

According to an embodiment, the at least one processor may be configured to control the switch to connect the first capacitor and the sensor, based on start of booting of the electronic device.

According to an embodiment, the at least one processor may be configured to determine an initial value of the sensor for determining whether a user grips at least a portion of the electronic device, based on the connection of the first capacitor and the sensor.

According to an embodiment, the at least one processor may be configured to control the switch to connect the antenna circuit and the sensor, based on the determination of the initial value of the sensor.

According to an embodiment, the at least one processor may be further configured to perform calibration of the sensor, based on the initial value, when the first capacitor and the sensor are connected.

According to an embodiment, the antenna circuit may include a second capacitor. A capacitance of the first capacitor and a capacitance of the second capacitor may have the same value.

According to an embodiment, the at least one processor may be configured to, control the switch to connect the first capacitor and the sensor in a state in which the sensor and the antenna circuit are not connected.

According to an embodiment, the at least one processor may be further configured to obtain a sensing value for determining whether the user grips an area where the antenna is positioned through the sensor, based on the connection of the antenna circuit and the sensor.

According to an embodiment, the at least one processor may be further configured to determine a strength of a signal to be transmitted through the antenna, based on the sensing value, and when the strength of the signal to be transmitted through the antenna exceeds a preset value, adjust the strength of the signal to be transmitted through the antenna.

According to an embodiment, the preset value may be set based on a designated specific ab sorption rate.

According to an embodiment, the first capacitor may include a shunt capacitor.

According to an embodiment, a method for operating an electronic device may comprise controlling a switch included in the electronic device to connect a first capacitor included in the electronic device and a sensor included in the electronic device, based on start of booting of the electronic device.

According to an embodiment, the method for operating the electronic device may comprise determining an initial value of the sensor for determining whether a user grips at least a portion of the electronic device, based on the connection of the first capacitor and the sensor.

According to an embodiment, the method for operating the electronic device may comprise controlling the switch to connect an antenna circuit included in the electronic device and the sensor, based on the determination of the initial value of the sensor.

According to an embodiment, the method may further comprise performing calibration of the sensor, based on the initial value, when the first capacitor and the sensor are connected.

According to an embodiment, the antenna circuit may include a second capacitor. A capacitance of the first capacitor and a capacitance of the second capacitor may have the same value.

According to an embodiment, the method may further comprise, controlling the switch to connect the first capacitor and the sensor in a state in which the sensor and the antenna circuit are not connected.

According to an embodiment, the method may further comprise obtaining a sensing value for determining whether the user grips an area where the antenna circuit is positioned through the sensor, based on the connection of the antenna circuit and the sensor.

According to an embodiment, the method may further comprise determining a strength of a signal to be transmitted through the antenna circuit, based on the sensing value, and when the strength of the signal to be transmitted through the antenna exceeds a preset value, adjusting the strength of the signal to be transmitted through the antenna.

According to an embodiment, the first capacitor may include a shunt capacitor.

According to an embodiment, an electronic device may comprise an antenna circuit including an antenna; a first capacitor, a sensor, and at least one processor.

According to an embodiment, the at least one processor may be configured to connect the first capacitor and the sensor using a first channel connected to the sensor, based on start of booting of the electronic device.

According to an embodiment, the at least one processor may be configured to determine an initial value of the sensor for determining whether a user grips at least a portion of the electronic device, based on the connection of the first capacitor and the sensor.

According to an embodiment, the at least one processor may be configured to connect the antenna circuit and the sensor using a second channel connected to the sensor, based on the determination of the initial value of the sensor.

According to an embodiment, the antenna circuit may include a second capacitor. A capacitance of the first capacitor and a capacitance of the second capacitor may have the same value.

According to an embodiment, the at least one processor may be configured to connect the first capacitor and the sensor, in a state in which the sensor and the antenna circuit are not connected.

According to an embodiment, the at least one processor may be further configured to obtain a sensing value for determining whether the user grips an area where the antenna is positioned through the sensor, based on the connection of the antenna circuit and the sensor using the second channel connected to the sensor.

According to an embodiment, the at least one processor may be further configured to determine a strength of a signal to be transmitted through the antenna, based on the sensing value, and when the strength of the signal to be transmitted through the antenna exceeds a preset value, adjust the strength of the signal to be transmitted through the antenna.

While the present disclosure has been shown and described with reference to various embodiments thereof, it will be understood by those skilled in the art that various changes in form and details may be made therein without departing from the present disclosure as defined by the appended claims and their equivalents.

What is claimed is:

1. An electronic device comprising:
    an antenna circuit including an antenna;
    a first capacitor;
    a sensor;
    a switch configured to selectively connect. either the first capacitor or the antenna circuit to the sensor:
    memory storing instructions; and
    at least one processor,
    wherein the instructions. when executed by the at least one processor, cause the electronic device to:
        control the switch to connect the first capacitor and the sensor, based on start of booting of the electronic device,
        determine a value of the sensor for determining whether a user grips at least a portion of the electronic device, based on connection of the first capacitor and the sensor, and
        control the switch to disconnect the first capacitor and the sensor and connect the antenna circuit and the sensor, based on the determination of the initialvalue of the sensor.

2. The electronic device of claim 1, wherein the instructions. when executed by the at least one processor, cause the electronic device further to perform calibration of the sensor, based on the determined value, when the first capacitor and the sensor are connected.

3. The electronic device of claim 1, wherein the antenna circuit includes a second capacitor, and
    wherein a capacitance of the first capacitor and a capacitance of the second capacitor have the same value.

4. The electronic device of claim 1, wherein the instructions. when executed by the at least one processor. cause the electronic device to control the switch to connect the first capacitor and the sensor in a state in which the sensor and the antenna circuit are not connected.

5. The electronic device of claim 1, wherein the instructions. when executed by the at least one processor, iscause the electronic device further to obtain a sensing value for determining whether the user grips an area where the antenna is positioned in the electronic device through the sensor, based on connection of the antenna circuit and the sensor.

6. The electronic device of claim 5, wherein the instructions. when executed by the at least one processor, cause the electronic device further to:
    determine a strength of a signal to be transmitted through the antenna, based on the sensing value, and
    when the strength of the signal to be transmitted through the antenna exceeds a preset value, adjust the strength of the signal to be transmitted through the antenna.

7. The electronic device of claim 6, wherein the preset value is set based on a designated specific absorption rate.

8. The electronic device of claim 1, wherein the first capacitor includes a shunt capacitor.

9. A method for operating an electronic device, the method comprising:
    controlling a switch included in the electronic device to connect a first capacitor included in the electronic device and a sensor included in the electronic device, based on start of booting of the electronic device;
    determining an value of the sensor for determining whether a user grips at least a portion of the electronic device, based on connection of the first capacitor and the sensor; and
    controlling the switch to disconnect the first capacitor and the sensor and connect an antenna circuit included in the electronic device and the sensor, based on the determination of the value of the sensor.

10. The method of claim 9, further comprising performing calibration of the sensor, based on the determined value, when the first capacitor and the sensor are connected.

11. The method of claim 9, wherein the antenna circuit includes a second capacitor, and
    wherein a capacitance of the first capacitor and a capacitance of the second capacitor have the same value.

12. The method of claim 9, wherein controlling the switch to connect the first capacitor and the sensor comprises:
    controlling the switch to connect the first capacitor and the sensor in a state in which the sensor and the antenna circuit are not connected.

13. The method of claim 9, further comprising obtaining a sensing value for determining whether the user grips an area where an antenna included in the antenna circuit is positioned in the electronic device through the sensor, based on connection of the antenna circuit and the sensor.

14. The method of claim 13, further comprising:
    determining a strength of a signal to be transmitted through the antenna, based on the sensing value; and
    when the strength of the signal to be transmitted through the antenna exceeds a preset value, adjusting the strength of the signal to be transmitted through the antenna.

15. The method of claim 9, wherein the first capacitor includes a shunt capacitor.

16. An electronic device comprising:
    an antenna circuit including an antenna;
    a first capacitor;
    a sensor;
    memory storing instructions: and
    at least one processor,
    wherein the instructions, when executed by the at least one processor, cause the electronic device to:
        connect the first capacitor and the sensor using a first channel connected to the sensor, based on start of booting of the electronic device,
        determine a value of the sensor for determining whether a user grips at least a portion of the electronic device, based on connection of the first capacitor and the sensor, and connect the antenna circuit and the sensor using a second channel connected to the sensor, based on the determination of the value of the sensor, while disconnecting the first capacitor and the sensor.

17. The electronic device of claim 16, wherein the antenna circuit includes a second capacitor, and wherein a capacitance of the first capacitor and a capacitance of the second capacitor have the same value.

18. The electronic device of claim 16, wherein the instructions. when executed by the at least one processor, cause the electronic device to connect the first capacitor and the sensor, in a state in which the sensor and the antenna circuit are not connected.

19. The electronic device of claim 16, wherein the instructions. when executed by the at least one processor, cause the electronic device further to obtain a sensing value for determining whether the user grips an area where the antenna is positioned in the electronic device through the sensor, based on connection of the antenna circuit and the sensor using the second channel connected to the sensor.

20. The electronic device of claim 19, wherein the instructions. when executed by the at least one processor, cause the electronic device further to:

determine a strength of a signal to be transmitted through the antenna, based on the sensing value, and when the strength of the signal to be transmitted through the antenna exceeds a preset value, adjust the strength of the signal to be transmitted through the antenna.

* * * * *